US008263312B2

(12) United States Patent
Fu et al.

(10) Patent No.: US 8,263,312 B2
(45) Date of Patent: Sep. 11, 2012

(54) ANTIREFLECTIVE COATING MATERIAL

(75) Inventors: Peng-Fei Fu, Midland, MI (US); Eric Scott Moyer, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 935 days.

(21) Appl. No.: 12/160,325

(22) PCT Filed: Dec. 7, 2006

(86) PCT No.: PCT/US2006/046810
§ 371 (c)(1),
(2), (4) Date: Jul. 9, 2008

(87) PCT Pub. No.: WO2007/094848
PCT Pub. Date: Aug. 23, 2007

(65) Prior Publication Data
US 2008/0318436 A1 Dec. 25, 2008

Related U.S. Application Data

(60) Provisional application No. 60/772,619, filed on Feb. 13, 2006.

(51) Int. Cl.
*G03F 7/00* (2006.01)

(52) U.S. Cl. ............ 430/272.1; 427/387; 428/447; 428/448; 430/117.1; 430/131; 430/317; 525/474; 524/366; 524/378

(58) Field of Classification Search .................. None
See application file for complete search history.

(56) References Cited

U.S. PATENT DOCUMENTS

| | | | |
|---|---|---|---|
| 4,587,138 A | 5/1986 | Yau et al. |
| 5,010,159 A | 4/1991 | Bank et al. |
| 5,100,503 A | 3/1992 | Allman et al. |
| 5,210,168 A | 5/1993 | Bergstrom et al. |
| 5,422,223 A | 6/1995 | Sachdev et al. |
| 5,441,765 A | 8/1995 | Ballance et al. |
| 5,691,396 A | 11/1997 | Takemura et al. |
| 5,708,099 A | 1/1998 | Kushibiki et al. |
| 5,762,697 A | 6/1998 | Sakamoto et al. |
| 5,891,529 A | 4/1999 | Harkness et al. |
| 6,057,239 A | 5/2000 | Wang et al. |
| 6,087,064 A | 7/2000 | Lin et al. |
| 6,156,640 A | 12/2000 | Tsai et al. |
| 6,177,143 B1 | 1/2001 | Treadwell et al. |
| 6,268,457 B1 | 7/2001 | Kennedy et al. |
| 6,281,285 B1 | 8/2001 | Becker et al. |
| 6,329,118 B1 | 12/2001 | Hussein et al. |
| 6,340,734 B1 | 1/2002 | Lin et al. |
| 6,344,284 B1 | 2/2002 | Chou |
| 6,359,096 B1 | 3/2002 | Zhong et al. |
| 6,365,765 B1 | 4/2002 | Baldwin et al. |
| 6,368,400 B1 | 4/2002 | Baldwin et al. |
| 6,395,397 B2 | 5/2002 | Hong et al. |
| 6,420,088 B1 | 7/2002 | Angelopoulos et al. |
| 6,424,039 B2 | 7/2002 | Wang et al. |
| 6,448,331 B1 * | 9/2002 | Ioka et al. ............ 524/859 |
| 6,461,955 B1 | 10/2002 | Tsu et al. |
| 6,503,692 B2 | 1/2003 | Angelopoulos et al. |
| 6,506,497 B1 | 1/2003 | Kennedy et al. |
| 6,515,073 B2 | 2/2003 | Sakamoto et al. |
| 6,576,681 B2 | 6/2003 | Zampini et al. |
| 6,589,711 B1 | 7/2003 | Subramanian et al. |
| 6,596,405 B2 | 7/2003 | Zampini et al. |
| 6,599,951 B2 | 7/2003 | Zampini et al. |
| 6,605,362 B2 | 8/2003 | Baldwin et al. |
| 6,730,454 B2 | 5/2004 | Pfeiffer et al. |
| 6,746,530 B2 | 6/2004 | Wang |
| 6,924,346 B2 | 8/2005 | Boisvert et al. |
| 6,982,006 B1 | 1/2006 | Boyers et al. |
| 7,368,173 B2 | 5/2008 | Zhong et al. |
| 2001/0036998 A1 | 11/2001 | Sakamoto et al. |
| 2002/0025495 A1 | 2/2002 | Ogata et al. |
| 2002/0042020 A1 | 4/2002 | Gallagher et al. |
| 2002/0055000 A1 | 5/2002 | Kennedy et al. |
| 2002/0065331 A1 | 5/2002 | Zampini et al. |
| 2002/0095018 A1 | 7/2002 | Baldwin et al. |
| 2002/0128388 A1 | 9/2002 | Kennedy et al. |
| 2002/0187422 A1 | 12/2002 | Angelopoulos et al. |
| 2002/0195419 A1 | 12/2002 | Pavelchek |
| 2002/0198269 A1 | 12/2002 | Zampini et al. |

(Continued)

FOREIGN PATENT DOCUMENTS

EP  1197511  4/2002

(Continued)

OTHER PUBLICATIONS

Schiavone et al., SiON based antireflective coating for 193nm lithography, Part of the SPIE Conference on Advances in Resist Technology and Processing XVI, SPIE vol. 3678, Mar. 1999, 391-395.

(Continued)

*Primary Examiner* — Marc Zimmer
(74) *Attorney, Agent, or Firm* — Erika Takeuchi

(57) ABSTRACT

Antireflective coatings comprising (i) a silsesquioxane resin having the formula $(PhSiO_{(3-x)/2}(OH)_x)_m(HSiO_{(3-x)/2}(OH)_x)_n(MeSiO_{(3-x)/2}(OH)_x)_p$ where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p=1; (ii) a polyethylene oxide fluid; and (iii) a solvent; and a method of forming said antireflective coatings on an electronic device.

25 Claims, No Drawings

U.S. PATENT DOCUMENTS

| | | |
|---|---|---|
| 2003/0022953 A1 | 1/2003 | Zampini et al. |
| 2003/0120018 A1 | 6/2003 | Baldwin et al. |
| 2003/0176614 A1* | 9/2003 | Hacker et al. .................. 528/42 |
| 2003/0199659 A1 | 10/2003 | Baldwin et al. |
| 2003/0209515 A1 | 11/2003 | Pavelchek |
| 2005/0282090 A1 | 12/2005 | Hirayama et al. |
| 2006/0021964 A1 | 2/2006 | Hirayama et al. |

FOREIGN PATENT DOCUMENTS

| | | |
|---|---|---|
| EP | 1197998 | 4/2002 |
| JP | 06-56560 | 3/1994 |
| WO | WO00/77575 | 12/2000 |
| WO | WO02/06402 | 1/2002 |
| WO | WO03/044077 | 5/2003 |
| WO | WO03/044078 | 5/2003 |
| WO | WO03/044079 | 5/2003 |
| WO | WO03/044600 | 5/2003 |
| WO | WO03/089992 | 10/2003 |
| WO | WO2004/007192 | 1/2004 |
| WO | WO2004/044025 | 5/2004 |
| WO | WO2004/046224 | 6/2004 |
| WO | WO2004/051376 | 6/2004 |
| WO | WO2004/090965 | 10/2004 |
| WO | WO2004/113417 | 12/2004 |
| WO | WO2006/065310 | 6/2006 |
| WO | WO2006/065316 | 6/2006 |
| WO | WO2006/065320 | 6/2006 |
| WO | WO2006/065321 | 6/2006 |

OTHER PUBLICATIONS

Kennedy et al., An Anthraacene-Organosiloxane Spin on Antireflective Coating for KrF Lithography, Advances in Resist Technology and Processing XX, Theodore H. Fedynshyn, Editor, Proceedings of SPIE vol. 5039, 2003, 144-151.

Kennedy et al., Organosiloxane based Bottom Antireflective Coatings for 193nm Lithography, Advances in Resist Technology and Processing XX. Theodore H. Fedynyshyn, Editor, Proceedings of SPIE vol. 5039. 2003, 929-939.

* cited by examiner

ANTIREFLECTIVE COATING MATERIAL

CROSS REFERENCE TO RELATED APPLICATIONS

This application is a U.S. national stage filing under 35 U.S.C. §371 of PCT Application No. PCT/US06/046810 filed on 7 Dec. 2006, currently pending, which claims the benefit of U.S. Provisional Patent Application No. 60/772,619 filed 13 Feb. 2006 under 35 U.S.C. §119 (e). PCT Application No. PCT/US06/046810 and U.S. Provisional Patent Application No. 60/772,619 are hereby incorporated by reference.

BACKGROUND OF THE INVENTION

With the continuing demand for smaller feature sizes in the semiconductor industry, 193 mm optical lithography has emerged very recently as the technology to produce devices with sub-100 nm. The use of such shorter wavelength of light requires the bottom antireflective coating (BARC) to reduce the reflection on the substrate and dampen the photoresist swing cure by absorbing light that has been passed through the photoresist. Commercially available antireflective coatings (ARC) consist of both organic and inorganic materials. Typically, the inorganic ARC, which exhibit good etch resistant, is CVD based and is subject to all of the integration disadvantage of extreme topography. The organic ARC materials are applied by spin-on process and have excellent fill and planarization properties, but suffer from poor etch selectivity to organic photoresist. As a result, a material that offers the combined advantages of inorganic and organic ARC materials is highly desired.

This invention pertains to silsesquioxane resins that exhibit antireflective coating properties for 193 nm light. These antireflective coatings can be stripped at the removal stage and the silsesquioxane resins are stable upon storage. In addition, the presence of a hydride group in the silsesquioxane resin is essential for the desired cure properties and strip-ability as a 193 nm ARC material.

BRIEF SUMMARY OF THE INVENTION

This invention pertains to a method of forming an antireflective coating on an electronic device comprising
(A) applying to an electronic device an ARC composition comprising
(i) a silsesquioxane resin having the formula $(PhSiO_{(3-x)/2}(OH)_x)_m HSiO_{(3-x)/2}(OH)_x)_n (MeSiO_{(3-x)/2}(OH)_x)_p$ where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p≈1;
(ii) a polyethylene oxide fluid; and
(iii) a solvent; and
(B) removing the solvent and curing the silsesquioxane resin to form an antireflective coating on the electronic device.

DETAILED DESCRIPTION OF THE INVENTION

The silsesquioxane resins (i) useful in forming the antireflective coating have the formula $(PhSiO_{(3-x)/2}(OH)_x)_m HSiO_{(3-x)/2}(OH)_x)_n (MeSiO_{(3-x)/2}(OH)_x)_p$ where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p≈1. Alternatively m has a value of 0.05 to 0.50, n has a value of 0.10 to 0.70 and p has a value of 0.10 to 0.70.

The silsesquioxane resins (i) useful in forming the antireflective coating have the formula $(PhSiO_{(3-x)/2}(OH)_x)_m HSiO_{(3-x)/2}(OH)_x)_n (MeSiO_{(3-x)/2}(OH)_x)_p$ where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p≈1. Alternatively m has a value of 0.05 to 0.95, alternatively 0.05 to 0.50, n has a value of 0.05 to 0.95, alternatively 0.10 to 0.70 and p has a value of 0.05 to 0.95, alternatively 0.10 to 0.70.

The silsesquioxane resin may be essentially fully condensed or may be only partially condensed. When the silsesquioxane resin is partially condensed less than 40 mole % of the units in the silsesquioxane resin should contain Si—OH groups. Higher amounts of these units can result in instability in the resin and the formation of gels. Typically 6 to 38 mole % of the units in the silsesquioxane resin contain Si—OH groups.

The silsesquioxane resin has a weight average molecular weight (Mw) in the range of 500 to 400,000 and preferably in the range of 500 to 100,000, alternatively 700 to 10,000.

Silsesquioxane resins useful herein may be exemplified by, but not limited to

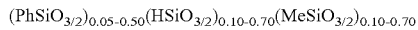

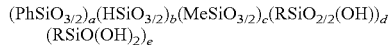

where R is selected form Ph, H and Me and 0.05≦a+d+e≦0.50, 0.10≦b+d+e≦0.70, 0.10≦c+d+e≦0.70, 0.06≦d+e≦0.4, and a+b+c+d+e≈1.

The silsesquioxane resins may be produced by methods known in the art. For example, the silsesquioxane resins may be produced by the hydrolysis and condensation of a mixture of a phenyl trialkoxysilane, hydrogen trialkoxysilane and methyl trialkoxysilane. Alternatively they may be produced by the hydrolysis and condensation of a phenyl trichlorosilane, hydrogen trichlorosilane and methyl trichlorosilane.

The silsesquioxane resin is typically produced in the presence of a solvent. Any suitable organic or silicone solvent that does not contain a functional group which may participate in the reaction may be used in producing the silsesquioxane resin. The solvent is generally used in an amount of 40 to 98 weight percent based on the total weight of solvent and silane reactants, alternatively 70 to 90 weight percent. The reaction may be carried out as a dual phase or single-phase system.

Organic solvents useful in producing the silsesquioxane resin may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol diethyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as isobutyl isobutyrate and propyl propronate. Useful silicone solvents may be exemplified by, but not limited to cyclic siloxanes such as octamethylcyclotetrasiloxane, and decamethylcyclopentasiloxane. A single solvent may be used or a mixture of solvents may be used.

The reaction to produce the silsesquioxane resin can be carried out at any temperature so long as it does not cause significant gellation or cause curing of the silsesquioxane resin. Typically the reaction is carried out at a temperature in the range of 5° C. to 150° C., with ambient temperature suggested.

The time to form the silsesquioxane resin is dependent upon a number of factors such as the temperature, the type and amount of silane reactants, and the amount of catalyst, if present. Typically the reaction time is from several minutes to several hours. One skilled in the art will be able to readily determine the time necessary to complete the reaction.

Following completion of the reaction the catalyst may be optionally removed. Methods for removing the catalyst are well know in the art and would include neutralization, stripping or water washing or combinations thereof. The catalyst may negatively impact the shelf life of the silicone resin especially when in solution thus its removal is suggested.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilane routes) and solvents. Methods for removing volatiles are known in the art and include, for example, distillation.

Following the reaction to produce the silsesquioxane resin a number of optional steps may be carried out to obtain the silsesquioxane resin in the desired form. For example, the silsesquioxane resin may be recovered in solid form by removing the solvent. The method of solvent removal is not critical and numerous methods are well known in the art (e.g. distillation under heat and/or vacuum). Once the silsesquioxane resin is recovered in a solid form, the resin can be optionally re-dissolved in the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

The ARC composition further comprises a polyethylene oxide fluid. The polyethylene oxide fluid ("PEO fluid") has the general formula $R^1(CH_2CH^2O)_zR^2$ where R1 and R2 are independent and are selected from H or a hydrocarbon group having 1 to 3 carbon atoms, an unsaturated hydrocarbon group, an acetyl group ($CH_3CO$—), and other organic groups, and z is such that the PEO fluid typically has a molecular weight of 50 to 5000 g/mol. R1 or R2 is typically allyl, H, methyl, ethyl, or acetyl. The PEO fluid may be exemplified by, but not limited to, allyl hydroxyl PEO fluid (Mw 400), allyl methoxyl PEO fluid (Mw 350) and others.

An ARC composition is produced by combining the silsesquioxane resin (i), PEO fluid (ii) with a solvent (iii). The ARC composition is then applied to an electronic device, the solvent is removed and the silsesquioxane resin is cured to produce the antireflective coating.

Typically the electronic device is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

The solvent (iii) useful herein may be the same or different from the solvent used in the production of the silsesquioxane resin. Useful solvents (iii) include, but are not limited to, 1-methoxy-2-propanol, propylene glycol monomethyl ethyl acetate (PGMEA) and cyclohexanone, among others. The ARC composition typically comprises from about 10% to about 99.9 wt % solvent based on the total weight of the ARC composition, alternatively 80 to 95 wt %.

The ARC composition can further comprise a cure catalyst. Suitable cure catalysts include inorganic acids, photo acid generators and thermal acid generators. Cure catalysts may be exemplified by, but not limited to sulfuric acid ($H_2SO_4$), (4-ethylthiophenyl) methyl phenyl sulfonium triflate and 2-Naphthyl diphenylsulfonium triflate. Typically a cure catalyst is present in an amount of up to 1000 ppm, alternatively 500 ppm, based on the total weight of the ARC composition.

Specific methods for application of the ARC composition to the electronic device include, but are not limited to, spin-coating, dip-coating, spay-coating, flow-coating, screen-printing and others. The preferred method for application is spin coating. Typically, coating involves spinning the electronic device, at about 2000 RPM, and adding the ARC composition to the surface of the spinning electronic device.

The solvent is removed and the silsesquioxane resin is cured to form the anti-reflective coating on the electronic device. The solvent may be removed by known methods such as heating or during application by spinning.

Curing generally comprises heating the coated electronic device to a sufficient temperature for a sufficient duration to lead to curing. For example, the coated electronic device can be heated at 80° C. to 450° C. for 0.1 to 60 minutes, alternatively 150° C. to 275° C. for of 0.5 to 5 minutes, alternatively 200° C. to 250° C. for 0.5 to 2 minutes. Any method of heating may be used during the curing step. For example, the coated electronic device may be placed in a quartz tube furnace, convection oven or allowed to stand on hot plates.

To protect the silsesquioxane resin from reactions with oxygen or carbon during curing, the curing step can be performed under an inert atmosphere. Inert atmospheres useful herein include, but are not limited to nitrogen and argon. By "inert" it is meant that the environment contain less than 50 ppm and preferably less than 10 ppm of oxygen. The pressure at which the curing and removal steps are carried out is not critical. The curing step is typically carried out at atmospheric pressure although sub or super atmospheric pressures may work also.

Once cured, the electronic device comprising the anti-reflective coating can be used in further substrate processing steps, such as photolithography. When used in photolithography, a resist image is formed over the anti-reflective coating. The process for forming the resist image comprises (a) forming a film of a resist composition on top of the anti-reflective coating; (b) imagewise exposing the resist film to radiation to produce an exposed film; and (c) developing the exposed film to produce an image. The anti-reflective coatings on the electronic device are particularly useful with resist compositions that are imagewise exposed to ultraviolet radiation having a wavelength of 157 nm to 365 nm, alternatively ultraviolet radiation having a wavelength of 157 nm or 193 nm. Once an image has been produced in the resist film, then a pattern is etched in the anti-reflective coating. Known etching materials may be used to remove the anti-reflective coating. Additional steps or removing the resist film and remaining anti-reflective coating may be employed to produce a device having the desired architecture.

EXAMPLES

The following examples are included to demonstrate embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All percentages are in wt. %.

Example 1

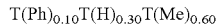

$T(Ph)_{0.10}T(H)_{0.30}T(Me)_{0.60}$

PGMEA (3400 g) and DI-water (120 g) were loaded into a reactor and mixed together. Propylene glycol methyl ether acetate (PGMEA, 450 g), phenyltrichlorosilane (63.4 g, 0.30 mole), methyltrichlorosilane (269.0 g, 1.80 mol), and trichlorosilane (121.9 g, 0.90 mole) were mixed in a separate flask. This mixture was added to the PGMEA/DI-water mixture under nitrogen over 1 hr 10 min. The mixture in the reactor was washed twice by adding DI water (1000 g each wash). The solution was then stripped after adding EtOH (240 g) to give a clear PGMEA solution. The solution is diluted to 10 Wt. % by adding more PGMEA and then filtrated through a 0.2 mm Teflon filter. Film thickness=2697 Å. At 193 nm: k=1.747, n=0.150. Wet removal rate in 1 min.: 100% by NE-89 (available from ATMI).

Example 2

Blend of Example 1 with Ally Hydroxyl PEO Fluid 10 g of the resin produced in Example 1 (10.7% solid in PGMEA, 40.58% of Si) and 0.62 g of ally hydroxyl PEO fluid (SW400, Mw=400) were mixed and diluted to a desired concentration by adding more PGMEA. The solution was then filtrated through a 0.2 micron Teflon filter and spin-coated. Film thickness=1527 Å. At 193 nm: k=1.698, n=0.209. Wet removal rate in 1 min.: 100% by NE-89.

Example 3

Blend of Example 1 with Ally Methoxyl PEO Fluid 10 g of the resin produced in Example 1 (10.7% solid in PGMEA, 40.58% of Si) and 0.62 g of ally methoxyl PEO fluid (AM 350, MW=350) were mixed and diluted to a desired concentration by adding more PGMEA. The solution was then filtrated through a 0.2 micron Teflon filter and spin-coated on a 4" silicon wafer. The film was cured on heating for 1 min. at 250° C., and its optical and film properties were measured. Film thickness=1459 Å. At 193 nm: k=1.684, n=0.201. Wet removal rate in 1 min.: 100% by NE-89.

Example 4

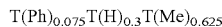

$T(Ph)_{0.075}T(H)_{0.3}T(Me)_{0.625}$

PGMEA (3400 g) and DI-water (120 g) were loaded into a reactor and mixed together. Propylene glycol methyl ether acetate (PGMEA, 450 g), phenyltrichlorosilane (63.4 g, 0.30 mole), methyltrichlorosilane (269.0 g, 1.80 mol), and trichlorosilane (121.9 g, 0.90 mole) were mixed in a separate flask. This mixture was added to the PGMEA/DI-water mixture under nitrogen over 1 hr 10 min. The mixture was washed twice by adding DI water twice (1000 g each wash). The solution was then stripped after adding EtOH (240 g) to give a clear PGMEA solution. The solution is diluted to 10 weight % by adding more PGMEA and then filtrated through a 0.2 mm Teflon filter. Film thickness=2207 Å. At 193 nm: k=1.660, n=0.150. Wet removal rate in 1 min.: 100% by NE-89.

Example 5

Blend of Example 4 with Ally Methoxyl PEO Fluid 200 g of the resin produced in Example 4 (10.0% solid in PGMEA) and 7.67 g of ally methoxyl PEO fluid (AM 350, MW=350) were mixed and diluted to a desired concentration by adding more PGMEA. The solution was then filtrated through a 0.2 micron Teflon filter and spin-coated on a 4" silicon wafer. The film was cured on heating for 1 min. at 250° C., and its optical and film properties were measured. Film thickness=2510 Å. At 193 nm: k=1.654, n=0.148. Wet removal rate in 1 min.: 100% by NE-89.

Film Coating and Characterization

The film coating on wafers was processed on a Karl Suss CT62 spin coater. The resin PGMEA solution was first filtered through a 0.2 micron TEFLON filter and then spin coated onto standard single side four inch polished low resistively wafers or double sided polished FTIR wafers (spin speed=2000 rpm; acceleration speed=5000, time=20 seconds unless otherwise indicated). Films were cured at a temperature (200 to 250° C.) for 60 seconds as indicated in the tables using a rapid thermal processing (RTP) oven with a nitrogen gas purge. The film thickness, refractive index and k value were determined using a J. A. Woollam ellipsometer. The thickness values recorded were the average of nine measurements. PGMEA resistance after cure was determined by measuring the film thickness change before and after PGMEA rinse. The wet removal rate was assessed with two commercial wet stripping solutions NE89 and CC1. Contact angle measurements were conducted using water and methylene iodide as liquids and the critical surface tension of wetting was calculated based on the Zisman approach. Results are summarized in Table 1.

TABLE 1

Comparison of the Optical and Cure Properties Between Ph/H/Me Resin and its PEO Blend

| Example | Resin | PEO Fluid | MW vs. Ps | Mw/Mn vs PS | Th, Å 250° C., 1 min | ΔTh, Å PGMEA | ΔTh, Å TMAH |
|---|---|---|---|---|---|---|---|
| 1 | 1 | None | 27600 | 6.5 | 2697 | 405 | |
| | | | | | 2729 | | 16 |
| 2 | 1 | SW400 | 18700 | 18.4 | 2878 | 42 | |
| | | | | | 2904 | | 7 |
| 3 | 1 | AM350 | 20900 | 23.6 | 2844 | 3 | |
| | | | | | 2838 | | 12 |
| 4 | 4 | None | 23400 | 5.7 | 2207 | 248 | |
| | | | | | 2215 | | 28 |
| 5 | 4 | AM350 | 28900 | 21.2 | 2510 | 5 | |
| | | | | | 2494 | | 13 |

That which is claimed is:

1. A method of forming an antireflective coating (ARC) on an electronic device comprising
   (A) applying to an electronic device an ARC composition comprising
      (i) a silsesquioxane resin having the formula

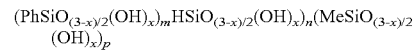

$(PhSiO_{(3-x)/2}(OH)_x)_m(HSiO_{(3-x)/2}(OH)_x)_n(MeSiO_{(3-x)/2}(OH)_x)_p$ where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p≈1;
      (ii) a polyethylene oxide fluid having the general formula $R^1(CH_2CH_2O)_zR^2$, wherein $R^1$ is allyl and $R^2$ is selected from H, a hydrocarbon group having 1 to 3 carbon atoms, an unsaturated hydrocarbon group, and an acetyl group (CH$_3$CO—), and z is such that the polyethylene oxide fluid typically has a molecular weight of 50 to 5000 g/mol; and (iii) a solvent; and (B) removing the solvent and curing the silsesquioxane resin to form an ARC on the electronic device.

2. The method as claimed in claim 1 wherein m has a value of 0.05 to 0.5, n has a value of 0.1 to 0.7, and p has a value of 0.1 to 0.7.

3. The method as claimed in claim 1 wherein in the silsesquioxane resin less than 40 mole % of the units contains Si—OH groups.

4. The method as claimed in claim 1 wherein in the silsesquioxane resin 6 to 38 mol % of the units contain Si—OH groups.

5. The method as claimed in claim 1 wherein the solvent (iii) is propylene glycol methyl ether acetate.

6. The method as claimed in claim 1 wherein the ARC composition contains 80 to 95 wt % of solvent (iii), based on the weight of the ARC composition.

7. The method as claimed in claim 1 wherein the ARC composition is applied by spin-coating.

8. The method as claimed in claim 1 wherein the silsesquioxane resin is cured by heating.

9. The method as claimed in claim 8 wherein the silsesquioxane resin is cured by heating at a temperature in the range of 150° C. to 275° C.

10. The method as claimed in claim 1 wherein the silsesquioxane resin is cured by heating at a temperature in the range of 200° C. to 250° C.

11. The method as claimed in claim 1 wherein the silsesquioxane resin is cured by heating in an inert atmosphere.

12. A method of forming an antireflective coating (ARC) on an electronic device comprising (A) applying to an electronic device an ARC composition comprising (i) a silsesquioxane resin having the formula

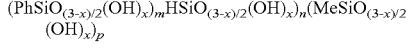

where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p≈1;

(ii) a polyethylene oxide fluid having the general formula R$^1$(CH$_2$CH$^2$O)$_z$R$^2$, wherein R$^1$ is allyl and R$^2$ is selected from H, a hydrocarbon group having 1 to 3 carbon atoms, an unsaturated hydrocarbon group, and an acetyl group (CH$_3$CO—), and z is such that the polyethylene oxide fluid typically has a molecular weight of 50 to 5000 g/mol; and (iii) a solvent; and (B) removing the solvent and curing the silsesquioxane resin to form an ARC on the electronic device; and (C) forming a resist image over the ARC.

13. The method as claimed in claim 12 wherein the resist image is formed by (a) forming a film of a resist composition on top of the ARC;

(b) imagewise exposing the resist film to radiation to produce an exposed film;

(c) developing the exposed film to produce the image.

14. A method of forming an antireflective coating (ARC) on an electronic device comprising:

(A) applying to an electronic device an ARC composition comprising:

(i) a silsesquioxane resin having the formula

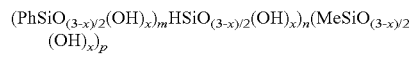

where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p≈1;

(ii) a polyethylene oxide fluid having the general formula R$^1$(CH$_2$CH$^2$O)$_z$R$^2$, wherein R$^1$ is allyl and R$^2$ is selected from H, a hydrocarbon group having 1 to 3 carbon atoms, an unsaturated hydrocarbon group, and an acetyl group (CH$_3$CO—), and z is such that the polyethylene oxide fluid typically has a molecular weight of 50 to 5000 g/mol; and (iii) a solvent; and (B) removing the solvent and curing the silsesquioxane resin to form an ARC on the electronic device;

(C) forming a resist image over the ARC; and (D) etching a pattern in the anti-reflective film.

15. A method of forming an antireflective coating (ARC) on an electronic device comprising (A) applying to an electronic device an ARC composition comprising (i) a silsesquioxane resin having the formula

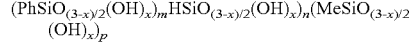

where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p 1;

(ii) a polyethylene oxide fluid having the general formula R$^1$(CH$_2$CH$^2$O)$_z$R$^2$, wherein R$^1$ is allyl and R$^2$ is selected from H, a hydrocarbon group having 1 to 3 carbon atoms, an unsaturated hydrocarbon group, and an acetyl group (CH$_3$CO—), and z is such that the polyethylene oxide fluid typically has a molecular weight of 50 to 5000 g/mol; and (iii) a solvent; and (B) removing the solvent and curing the silsesquioxane resin to form an ARC on the electronic device;

(C) forming a resist image over the ARC;

(D) etching a pattern in the anti-reflective film; and (E) removing the resist image and the anti-reflective film.

16. An anti-reflective coating (ARC) composition comprising (i) a silsesquioxane resin having the formula

where Ph is a phenyl group, Me is a methyl group, x has a value of 0, 1 or 2; m has a value of 0.01 to 0.99, n has a value of 0.01 to 0.99, p has a value of 0.01 to 0.99, and m+n+p≈1;

(ii) a polyethylene oxide fluid having the general formula R$^1$(CH$_2$CH$^2$O)$_z$R$^2$, wherein R$^1$ is allyl and R$^2$ is selected from H, a hydrocarbon group having 1 to 3 carbon atoms, an unsaturated hydrocarbon group, and an acetyl group (CH$_3$CO—), and z is such that the polyethylene oxide fluid typically has a molecular weight of 50 to 5000 g/mol; and (iii) a solvent.

17. The composition as claimed in claim 16 wherein m has a value of 0.05 to 0.5, n has a value of 0.1 to 0.7, and p has a value of 0.1 to 0.7.

18. The composition as claimed in claim 16 wherein in the silsesquioxane resin less than 40 mole % of the units contains Si—OH groups.

19. The composition as claimed in claim 16 wherein in the silsesquioxane resin 6 to 38 mol % of the units contain Si—OH groups.

20. The composition as claimed in claim 16 wherein the solvent (ii) is propylene glycol methyl ether acetate.

21. The composition as claimed in claim 16 wherein the ARC composition contains 80 to 95 wt % of solvent, based on the weight of the ARC composition.

22. The composition as claimed in claim 16 wherein $R^2$ is H.

23. The composition as claimed in claim 16, wherein $R^2$ is methyl.

24. The composition as claimed in claim 16 wherein the polyethylene oxide fluid is allyl hydroxyl polyethylene oxide fluid.

25. The composition as claimed in claim 16 wherein the polyethylene oxide fluid is allyl methoxyl polyethylene oxide fluid.

* * * * *